(12) United States Patent
Kawaguchi et al.

(10) Patent No.: US 7,029,761 B2
(45) Date of Patent: Apr. 18, 2006

(54) BONDING LAYER FOR BONDING RESIN ON COPPER SURFACE

(75) Inventors: Mutsuyuki Kawaguchi, Amagasaki (JP); Satoshi Saito, Amagasaki (JP); Jun Hisada, Amagasaki (JP); Toshiko Nakagawa, Amagasaki (JP)

(73) Assignee: MEC Company Ltd., Amagasaki (JP)

( * ) Notice: Subject to any disclaimer, the term of this patent is extended or adjusted under 35 U.S.C. 154(b) by 0 days.

(21) Appl. No.: 10/826,508

(22) Filed: Apr. 16, 2004

(65) Prior Publication Data

US 2004/0219375 A1 Nov. 4, 2004

(30) Foreign Application Priority Data

Apr. 30, 2003 (JP) ............................. 2003-125632

(51) Int. Cl.
*B32B 15/04* (2006.01)
*B32B 15/08* (2006.01)
*B32B 15/20* (2006.01)

(52) U.S. Cl. ...................... 428/647; 428/674; 428/675; 428/336; 428/457

(58) Field of Classification Search ............... 420/470, 420/471, 473, 476, 560, 561, 587, 589; 428/646, 428/647, 675, 674, 213, 214, 215, 216, 336, 428/457
See application file for complete search history.

(56) References Cited

U.S. PATENT DOCUMENTS

| | | | | |
|---|---|---|---|---|
| 5,494,565 A | * | 2/1996 | Schenzel et al. | 205/240 |
| 5,667,849 A | * | 9/1997 | Carey et al. | 427/431 |
| 5,695,822 A | * | 12/1997 | Carey et al. | 427/329 |
| 6,080,497 A | * | 6/2000 | Carey et al. | 428/647 |
| 6,099,713 A | | 8/2000 | Yanada et al. | 205/253 |
| 6,180,174 B1 | * | 1/2001 | Sugawara et al. | 427/376.3 |
| 6,183,545 B1 | | 2/2001 | Okuhama et al. | 106/1.18 |
| 6,329,074 B1 | * | 12/2001 | Fujiwara et al. | 428/632 |
| 6,361,823 B1 | | 3/2002 | Bokisa et al. | 427/97.3 |
| 6,607,653 B1 | | 8/2003 | Tsuji et al. | 205/241 |
| 6,797,142 B1 | | 9/2004 | Crosby | 205/145 |
| 6,821,323 B1 | | 11/2004 | Bell et al. | 106/1.12 |
| 2003/0035976 A1 | * | 2/2003 | Strobel | 428/557 |
| 2003/0150743 A1 | | 8/2003 | Obata et al. | 205/252 |
| 2005/0109631 A1 | * | 5/2005 | Kwon et al. | 205/191 |

FOREIGN PATENT DOCUMENTS

| | | |
|---|---|---|
| EP | 0 216 531 | 4/1987 |
| EP | 0 278 752 | 8/1988 |
| EP | 0 310 010 | 4/1989 |
| EP | 0 469 703 | 2/1992 |
| JP | 1-109796 | 4/1989 |
| JP | 4-233793 | 8/1992 |
| JP | 10-36973 | 2/1998 |
| JP | 10-144848 | 5/1998 |
| JP | 11-21673 | 1/1999 |
| JP | 11-121924 | 4/1999 |
| JP | 2000-340948 | 12/2000 |

* cited by examiner

*Primary Examiner*—Michael E. Lavilla
(74) *Attorney, Agent, or Firm*—Hamre, Schumann, Mueller & Larson, P.C.

(57) ABSTRACT

A bonding layer for bonding resin is provided that is formed on a copper surface, and contains an alloy of: (a) copper; (b) tin; and (c) at least one type of metal (third metal) selected from the group consisting of: silver, zinc, aluminum, titanium, bismuth, chromium, iron, cobalt, nickel, palladium, gold, and platinum. The copper is contained in an amount of 1 to 50 atom %, the tin is contained in an amount of 20 to 98 atom %, and the third metal is contained in an amount of 1 to 50 atom %. The bonding layer has a thickness of not less than 0.001 μm and not more than 1 μm. Thus, adhesion between copper and resin can be enhanced.

7 Claims, 1 Drawing Sheet

BONDING LAYER FOR BONDING RESIN ON COPPER SURFACE

BACKGROUND OF THE INVENTION

1. Field of the Invention

The present invention relates to a bonding layer for bonding resin on a copper surface. More specifically, this invention relates to a bonding layer for bonding resin on a copper surface, which is used for various types of electronic components such as a printed wiring board, components to be mounted on a semiconductor, liquid crystal devices, electroluminescent elements and the like.

2. Related Background Art

Multilayer wiring boards in common use are produced in the following manner. That is, an inner-layer substrate having a conductive layer of copper on its surface is press-laminated to another inner-layer substrate and copper foil so as to sandwich a prepreg between them. Electrical connections between the respective conductive layers are established by way of through-holes, i.e. piercing holes whose walls are plated with copper. In order to enhance adhesion to the prepreg, a needle-like layer of copper oxide that is referred to as a black oxide or a brown oxide is formed on the copper surface of the inner-layer substrate. In this method, the needle-like layer of copper oxide cuts into the prepreg to produce the anchoring effect, thereby enhancing adhesion.

While exhibiting excellent adhesion to the prepreg, the layer of copper oxide dissolves and discolors when brought into contact with an acidic liquid in a process of plating the through-holes, and thus is likely to cause a defect called haloing, which is problematic.

With respect to this problem, as an alternative to the method using a black oxide or a brown oxide, a method in which a tin layer is formed on a copper surface of an inner-layer substrate has been proposed as in EP Publication No. 0 216 531 A1 and JP 4(1992)-233793 A. Further, JP 1(1989)-109796 A proposes that a copper surface be plated with tin and then further treated with a silane coupling agent so that adhesion between copper and resin is enhanced. Further, JP2000-340948 A proposes to form a copper-tin alloy layer on a copper surface so as to enhance adhesion between copper and resin. Further, it also is proposed that the copper surface be roughened by etching so as to produce the anchoring effect.

However, in each of the above-mentioned methods in which a tin layer or a copper-tin alloy layer is formed on a copper surface, with respect to a so-called hard resin, which is a type of resin having a high glass transition temperature, the effect of enhancing adhesion may not be attained sufficiently, which has been disadvantageous. Further, in the above-mentioned method described in JP 1(1989)-109796 A, tin plating causes copper to be eluted into a plating solution, resulting in the narrowing of wiring. Moreover, when in use, silane coupling agents are hard to handle, which is problematic. Further, adhesion to resin is not attained sufficiently.

SUMMARY OF THE INVENTION

In order to solve the above-mentioned problems with the conventional technique, the present invention provides a bonding layer for bonding resin that is formed on a copper surface and allows adhesion between copper and resin to be enhanced.

A bonding layer for bonding resin according to the present invention is a bonding layer for bonding resin formed on a copper surface, and contains an alloy of: (a) copper; (b) tin; and (c) at least one type of metal (third metal) selected from the group consisting of: silver, zinc, aluminum, titanium, bismuth, chromium, iron, cobalt, nickel, palladium, gold, and platinum. In the bonding layer for bonding resin, the copper is contained in an amount of 1 to 50 atom %, the tin is contained in an amount of 20 to 98 atom %, and the third metal is contained in an amount of 1 to 50 atom %. The bonding layer for bonding resin has a thickness of not less than 0.001 μm and not more than 1 μm.

DETAILED DESCRIPTION OF THE INVENTION

Figure 1:
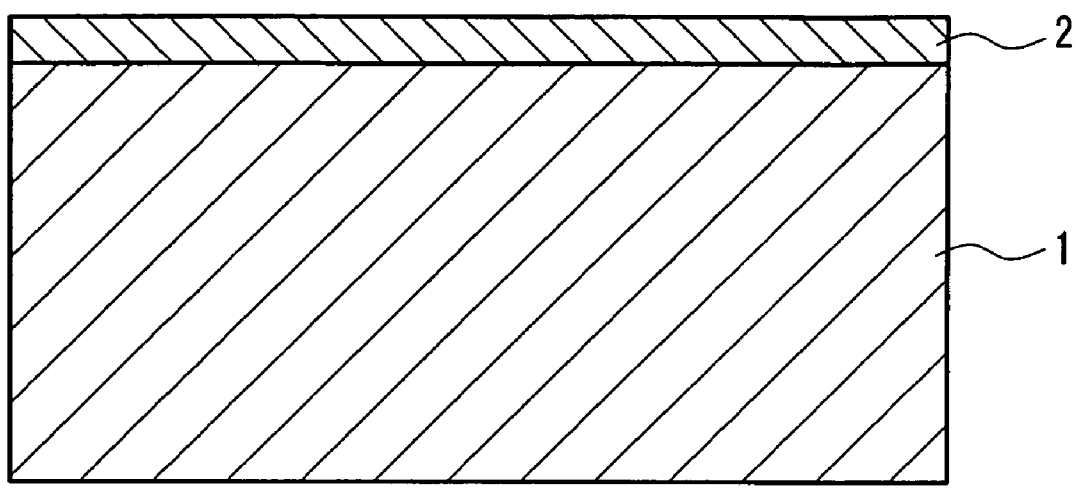
FIG. 1 is a cross-sectional view of a bonding layer for bonding resin formed on a copper surface of one example according to the present invention.

In the present invention, a bonding layer for bonding resin formed from an alloy of copper, tin, and a third metal is formed on a surface of copper. The bonding layer for bonding resin allows adhesion between copper and resin to be improved.

There is no particular limit to a copper surface to be used, and any copper surface is used as long as the copper surface is intended to be bonded to resin. A copper surface to be used can be any surface of copper in various uses such as in the forms of, for example, foil (electrodeposited copper foil, rolled copper foil), a plated film (electroless copper plated film, electrolytic copper plated film), a wire, a rod, a tube, a plate and the like, which are used for electronic components such as an electronic substrate, a lead frame and the like, ornamentation, construction materials and the like. The copper may contain another element according to its intended use and thus may be brass, bronze, cupro-nickel, arsenic copper, silicon copper, titanium copper, chromium copper or the like.

The copper surface may be smooth in shape or roughened by etching or the like. For example, in order to attain the anchoring effect when the surface is laminated to resin, preferably, the surface is roughened. Further, in the case of recently used copper wiring through which a high-frequency electric signal passes, preferably, the surface is a smooth surface having a centerline average roughness Ra of not more than 0.1 μm. Particularly, in the case of fine copper wiring, in the present invention, the occurrence of, for example, breaking due to etching for obtaining roughness is prevented for the following reason. That is, in the present invention, even a smooth surface can provide sufficient adhesion without the anchoring effect attained by surface roughening.

The bonding layer for bonding resin is a layer formed from an alloy of copper, tin, and a third metal (at least one type of metal selected from the group consisting of: silver, zinc, aluminum, titanium, bismuth, chromium, iron, cobalt, nickel, palladium, gold, and platinum). With this layer present on a copper surface, when the copper surface is bonded to resin, adhesion between copper and resin is enhanced considerably. In the composition of the bonding layer for bonding resin, copper is contained in an amount of 1 to 50 atom %, preferably, 5 to 45 atom %, and more preferably, 10 to 40 atom %. When copper is contained in an amount more than 50 atom % or less than 1 atom %, adhesion to resin is not attained sufficiently.

In the bonding layer for bonding resin, tin is contained in an amount of 20 to 98 atom %, preferably, 30 to 90 atom %, and more preferably, 40 to 80 atom %. When tin is contained in an amount more than 98 atom % or less than 20 atom %, adhesion to resin is not attained sufficiently.

In the bonding layer for bonding resin, the third metal is contained in an amount of 1 to 50 atom %, preferably, 2 to 45 atom %, and more preferably, 3 to 40 atom %. When the third metal is contained in an amount more than 50 atom % or less than 1 atom %, adhesion to resin is not attained sufficiently.

The bonding layer for bonding resin has a copper base, and thus has a copper percentage that increases with increasing depth from the surface thereof due to diffusion of atoms. In this specification, the bonding layer for bonding resin refers to an alloy layer having a composition that falls within the above-mentioned ranges.

The percentage of metal of the surface can be determined, for example, by the Auger electron spectroscopy analysis or ESCA (X-ray photo-electron spectroscopy), or using an EPMA (electron probe X-ray microanalyzer).

Furthermore, although a copper-tin-third metal alloy contains oxygen atoms due to contact with air or the like, the presence of the oxygen atoms has no adverse effect on adhesion to resin. Therefore, the effect of the present invention is maintained even after undergoing a treatment such as heating, which accelerates the oxidation of the bonding layer. Further, generally, the bonding layer also contains other types of atoms from various contamination sources.

The bonding layer for bonding resin has a thickness of 0.001 to 1 μm, preferably, 0.001 to 0.5 μm, and more preferably, 0.001 to 0.1 μm. In the case where the bonding layer has a thickness more than 1 μm or less than 0.001 μm, adhesion to resin is not attained sufficiently.

There is no particular limit to a method of forming the bonding layer for bonding resin. The bonding layer for bonding resin can be formed by, for example, a method in which an alloy layer of tin and the third metal is formed on a copper surface, and then a portion of the alloy layer of tin and the third metal is removed so that a portion of the alloy layer other than the portion, which is an alloy layer of copper, tin, and the third metal remains on the copper surface.

When an alloy layer of tin and the third metal is formed on a copper surface, an alloy layer (bonding layer) of copper, tin, and the third metal is formed by diffusion on an interface between copper and tin with the third metal.

The alloy layer of tin and the third metal can be formed by, for example, a method utilizing contact with an aqueous solution comprising:
(a) 1 to 50 mass % of inorganic acid such as sulfuric acid or organic acid such as acetic acid;
(b) 0.05 to 10 mass % (in terms of the concentration of tin) of stannous salt such as stannous sulfate;
(c) 0.1 to 20 mass % of metal salt such as silver acetate;
(d) 1 to 50 mass % of thiourea or the like as a reaction accelerator; and
(e) 1 to 80 mass % of diethylene glycol or the like as a diffusive retaining solvent.

The reaction accelerator is an agent that is coordinated to copper as a base material to form a chelate and facilitates forming a bonding layer for bonding resin on a copper surface. For example, thiourea derivatives such as thiourea, 1,3-dimethyl thiourea, 1,3-diethyl-2-thiourea, thioglycolic acid and the like are used. The concentration of a reaction accelerator is in a range of preferably, 1 to 50%, more preferably, 5 to 40%, and most preferably, 10 to 30%. When the concentration of a reaction accelerator is higher than 50%, the adhesion to resin tends to decrease. Further, when the concentration of a reaction accelerator is lower than 1%, the speed at which a bonding layer for bonding resin is formed tends to be low.

The diffusive retaining solvent is a solvent that facilitates maintenance of the concentration of a reactive component required for a copper surface in the vicinity of the copper surface. Examples of a diffusive retaining solvent include glycols such as ethylene glycol, diethylene glycol, propylene glycol and the like, and glycol esters such as cellosolve, carbitol, butyl carbitol and the like. The concentration of a diffusive retaining solvent is in a range of preferably, 1 to 80%, more preferably, 5 to 60%, and most preferably, 10 to 50%. With a concentration higher than 80%, adhesion to resin tends to decrease. Further, with a concentration lower than 1%, the formation of a bonding layer for bonding resin tends to be hindered.

There is no particular limit to a condition under which a surface of copper is brought into contact with the above-mentioned solution for forming a bonding layer for bonding resin. For example, the surface should be brought into contact with the solution at a temperature of 10 to 70° C. for 5 seconds to 5 minutes by the dipping method or the like.

When an alloy layer of tin and the third metal is formed on a surface of copper in this manner, an alloy layer (bonding layer) of copper, tin, and the third metal is formed by diffusion on an interface between copper and tin with the third metal.

In order to accelerate the diffusion, a heat treatment or the like may be performed.

As a method for selectively removing the alloy layer of tin and the third metal, for example, the alloy layer of tin and the third metal is etched selectively using an etchant.

As the etchant used for selective etching, for example, a "MEC Remover S-651A", a trade name of MEC Company Ltd. or the like can be used. As another example of the etchant, an aqueous solution containing inorganic acid such as nitric acid or the like also can be used.

Furthermore, by selecting the composition of the aqueous solution and a condition under which a surface of copper is brought into contact with the solution, a bonding layer formed from copper, tin, and the third metal may be formed directly on the surface of copper.

The bonding layer for bonding resin formed on a copper surface as described above allows adhesion between copper and various types of resin to be enhanced considerably.

As resin to be bonded, thermoplastic resins such as AS resin, ABS resin, fluororesin, polyamide, polyethylene, polyethylene terephthalate, polyvinylidene chloride, polyvinyl chloride, polycarbonate, polystyrene, polysulfone, polypropylene, liquid crystal polymer and the like, and thermosetting resins such as epoxy resin, phenol resin, polyimide, polyurethane, bismaleimide triazine resin, modified polyphenylene ether, cyanate ester and the like can be used. These resins also may be of a type modified with a functional group or toughened with glass fibers, aramid fibers or the like.

In the case where the bonding layer for bonding resin according to the present invention is formed on a copper surface of a wiring board having an interface between copper and resin, a highly reliable wiring board is obtained by attaining excellent adhesion between a copper constituting a conductive layer and an interlayer insulating resin (prepreg, adhesive for electroless plating, film-like resin, liquid resin, photosensitive resin, thermosetting resin, thermoplastic resin), solder resist, etching resist, conductive resin, conductive paste, conductive adhesive, resin for a dielectric, resin for filling holes, flexible coverlay film and the like.

Of particular usefulness is the use in a build-up wiring board in which fine copper wiring and via holes are formed. The build-up wiring boards are categorized as a type formed by the simultaneous lamination method and a type formed by the sequential build-up method.

Furthermore, in a so-called metal core substrate in which a copper plate is used as a core material, in the case where the surface of the copper plate constitutes the above-mentioned bonding layer for bonding resin, a metal core substrate that exhibits excellent adhesion between the copper plate and an insulating resin that is laminated to the copper plate is obtained.

As described above, in the present invention, a bonding layer for bonding resin formed from an alloy of copper, tin, and a third metal is formed on a copper surface, and thus adhesion between copper and resin can be enhanced further.

FIG. 1 is a cross-sectional view of a bonding layer for bonding resin formed on a copper surface of one example according to the present invention. That is, a bonding layer 2 for bonding resin having a thickness of not less than 0.001 μm and not more than 1 μm is formed on the surface of a copper base material 1.

Hereinafter, the present invention will be described more specifically by way of examples.

EXAMPLE 1

Electrodeposited copper foil of 35 μm in thickness was cleaned by spraying 5% hydrochloric acid thereon at room temperature for 10 seconds, and then washed with water and dried. Then, the electrodeposited copper foil was dipped into an aqueous solution that was formed from 20% acetic acid (mass %, the same applies hereinafter), 2% stannous acetate (in terms of $Sn^{2+}$), 3% silver acetate (in terms of $Ag^+$), 15% thiourea, 30% diethylene glycol, and remainder ion-exchanged water under the condition of a temperature of 30° C. and a dipping time of 30 seconds, and then washed with water and dried.

Next, the electrodeposited copper foil was dipped into a "MEC Remover S-651A" (aqueous solution mainly containing nitric acid), a trade name of MEC Company Ltd., at room temperature for 30 seconds, and then washed with water and dried, and thus a bonding layer for bonding resin was formed on the surface of the copper foil. The atomic composition of a surface thus obtained was examined by the Auger spectroscopy analysis. The result is shown in Table 1. Further, the thickness of the bonding layer for bonding resin is shown in Table 1.

Next, a resin with copper foil for a build-up wiring board (ABF-SHC resin with copper foil produced by Ajinomoto Co., Inc.) was laminated on one surface of copper foil thus obtained, and pressing was performed while applying heat. In compliance with JIS C 6481, a layered product thus obtained was examined for the peel strength of the electrodeposited copper foil. The result is shown in Table 1.

EXAMPLE 2

Electrodeposited copper foil cleaned in the same manner as in Example 1 was dipped into an aqueous solution that was formed from 17% acetic acid, 2% stannous acetate (in terms of $Sn^{2+}$), 1.5% bismuth iodide (in terms of $Bi^{2+}$), 21% thiourea, 32% cellosolve, and remainder ion-exchanged water under the condition of a temperature of 30° C. and a dipping time of 30 seconds, and then washed with water and dried. Except for the above, a bonding layer for bonding resin was formed in the same manner as in Example 1. The atomic composition of a surface thus obtained and the thickness of the bonding layer for bonding resin are shown in Table 1.

Next, in the same manner as in Example 1, the peel strength of the copper foil was examined. The result thereof is shown in Table 1.

EXAMPLE 3

Electrodeposited copper foil cleaned in the same manner as in Example 1 was dipped into an aqueous solution that was formed from 15% sulfuric acid, 1.5% stannous sulfate (in terms of $Sn^{2+}$), 3.5% nickel sulfate (in terms of $Ni^+$), 21% thiourea, 30% diethylene glycol, and remainder ion-exchanged water under the condition of a temperature of 30° C. and a dipping time of 30 seconds, and then washed with water and dried. Except for the above, a bonding layer for bonding resin was formed in the same manner as in Example 1. The atomic composition of a surface thus obtained and the thickness of the bonding layer for bonding resin are shown in Table 1.

Next, in the same manner as in Example 1, the peel strength of the copper foil was examined. The result thereof is shown in Table 1.

EXAMPLE 4

Electrodeposited copper foil cleaned in the same manner as in Example 1 was dipped into an aqueous solution that was formed from 20% acetic acid, 2% stannous acetate (in terms of $Sn^{2+}$), 0.1% silver acetate (in terms of $Ag^+$), 15% thiourea, 30% diethylene glycol, and remainder ion-exchanged water under the condition of a temperature of 30° C. and a dipping time of 30 seconds, and then washed with water and dried. Except for the above, a bonding layer for bonding resin was formed in the same manner as in Example 1. The atomic composition of a surface thus obtained and the thickness of the bonding layer for bonding resin are shown in Table 1.

Next, in the same manner as in Example 1, the peel strength of the copper foil was examined. The result thereof is shown in Table 1.

EXAMPLE 5

Electrodeposited copper foil cleaned in the same manner as in Example 1 was dipped into an aqueous solution that was formed from 20% acetic acid, 2% stannous acetate (in terms of $Sn^{2+}$), 10.0% silver acetate (in terms of $Ag^+$), 15% thiourea, 30% diethylene glycol, and remainder ion-exchanged water under the condition of a temperature of 30° C. and a dipping time of 30 seconds, and then washed with water and dried. Except for the above, a bonding layer for bonding resin was formed in the same manner as in Example 1. The atomic composition of a surface thus obtained and the thickness of the bonding layer for bonding resin are shown in Table 1.

Next, in the same manner as in Example 1, the peel strength of the copper foil was examined. The result thereof is shown in Table 1.

EXAMPLE 6

In Example 1, in performing dipping into an aqueous solution that was formed from 20% acetic acid, 2% stannous acetate (in terms of $Sn^{2+}$), 3% silver acetate (in terms of $Ag^+$), 15% thiourea, 30% diethylene glycol, and remainder ion-exchanged water, the dipping time was changed to 5 seconds. Except for this, a bonding layer for bonding resin was formed in the same manner as in Example 1. The atomic composition of a surface thus obtained and the thickness of the bonding layer for bonding resin are shown in Table 1. Next, in the same manner as in Example 1, the peel strength of the copper foil was examined. The result thereof is shown in Table 1.

EXAMPLE 7

In Example 1, in performing dipping into an aqueous solution that was formed from 20% acetic acid, 2% stannous acetate (in terms of $Sn^{2+}$), 3% silver acetate (in terms of $Ag^+$), 15% thiourea, 30% diethylene glycol, and remainder ion-exchanged water, the dipping time and the temperature for the dipping were changed to 5 minutes and 45° C., respectively. Except for this, a bonding layer for bonding resin was formed in the same manner as in Example 1. The atomic composition of a surface thus obtained and the thickness of the bonding layer for bonding resin are shown in Table 1.

Next, in the same manner as in Example 1, the peel strength of the copper foil was examined. The result thereof is shown in Table 1.

EXAMPLE 8

Electrodeposited copper foil cleaned in the same manner as in Example 1 was dipped into an aqueous solution that was formed from 20% acetic acid, 2% stannous acetate (in terms of $Sn^{2+}$), 20.0% silver acetate (in terms of $Ag^+$), 15% thiourea, 30% diethylene glycol, and remainder ion-exchanged water under the condition of a temperature of 30° C. and a dipping time of 30 seconds, and then washed with water and dried. Except for the above, a bonding layer for bonding resin was formed in the same manner as in Example 1. The atomic composition of a surface thus obtained and the thickness of the bonding layer for bonding resin are shown in Table 1.

Next, in the same manner as in Example 1, the peel strength of the copper foil was examined. The result thereof is shown in Table 1.

COMPARATIVE EXAMPLE 1

Electrodeposited copper foil of 35 μm in thickness was cleaned by spraying 5% hydrochloric acid thereon at room temperature for 10 seconds, and then washed with water and dried. Then, the electrodeposited copper foil was dipped into an aqueous solution that was formed from 20% acetic acid, 2% stannous acetate (in terms of $Sn^{2+}$), 15% thiourea, 30% diethylene glycol, and remainder ion-exchanged water under the condition of a temperature of 30° C. and a dipping time of 30 seconds, and was washed with water and dried, and thus a tin layer was formed on the surface of the copper foil.

Next, in the same manner as in Example 1, a resin for a build-up wiring board was laminated thereto, and the peel strength between the resin and the electrodeposited copper foil was examined. The result is shown in Table 1.

COMPARATIVE EXAMPLE 2

In the same manner as in Comparative Example 1, a tin layer was formed on the surface of copper foil.

Next, the copper foil with the tin layer was dipped into a MEC Remover S-651A produced by MEC Company Ltd. at room temperature for 30 seconds, and then washed with water and dried, and thus a bonding layer bonding resin was formed on the surface of the copper foil.

Next, in the same manner as in Example 1, a resin for a build-up wiring board was laminated thereto, and the peel strength between the resin and the electrodeposited copper foil was examined. The result is shown Table 1.

TABLE 1

| Example | Atomic composition of a bonding layer for bonding resin (atom %) | Thickness of a bonding layer for bonding resin (μm) | Peel strength test (kgf/cm) |
|---|---|---|---|
| 1 | Cu/Sn/Ag = 33/58/9 | 0.009 | 1.15 |
| 2 | Cu/Sn/Bi = 28/69/3 | 0.015 | 1.08 |
| 3 | Cu/Sn/Ni = 39/50/11 | 0.007 | 1.00 |
| 4 | Cu/Sn/Ag = 1/98/1 | 0.09 | 0.91 |
| 5 | Cu/Sn/Ag = 50/20/30 | 0.008 | 0.89 |
| 6 | Cu/Sn/Ag = 31/60/9 | 0.001 | 0.89 |
| 7 | Cu/Sn/Ag = 15/75/10 | 1.000 | 0.83 |
| 8 | Cu/Sn/Ag = 20/30/50 | 0.005 | 0.85 |
| Com. Ex. 1 | Sn = 100 | (Thickness of a tin layer) 0.20 | 0.20 |
| Com. Ex. 2 | Cu/Sn = 70/30 | (Thickness of a copper-tin alloy layer) 0.05 | 0.35 |

As is apparent from Table 1, it was confirmed that the respective bonding layers for bonding resin of Examples according to the present invention had high peel strength (adhesion) between copper foil and resin.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A bonding structure for bonding resin comprising a bonding layer formed an a copper surface, the bonding layer comprising an alloy of:
   (a) copper;
   (b) tin; and
   (c) one metal (third metal) selected from the group consisting of: silver, zinc, aluminum, bismuth, cobalt, and nickel,
   wherein the copper is contained in an amount of to 5 to 45 atom %, the tin is contained in an amount of 30 to 90 atom %, and the third metal is contained in an amount of 2 to 45 atom %, and
   the bonding layer has a thickness of not less than 0.001 μm and not more than 0.5 μm, and
   wherein the bonding layer is useful for an adhesive layer to resin.

2. The bonding layer according to claim 1,
   wherein the copper surface is smooth.

3. The bonding layer according to claim 1, wherein the copper surface is rough.

4. The bonding layer according to claim 1, wherein the bonding layer contains the copper in an amount in a range of 10 to 40 atom %.

5. The bonding layer according to claim 1, wherein the bonding layer contains the tin in an amount in a range of 40 to 80 atom %.

6. The bonding layer according to claim 1, wherein the bonding layer contains the third metal in an amount in a range of 3 to 40 atom %.

7. The bonding layer according to claim 1, wherein the bonding layer has a thickness in a range of 0.001 to 0.1 μm.

* * * * *